(12) United States Patent
Lin

(10) Patent No.: US 8,492,790 B2
(45) Date of Patent: Jul. 23, 2013

(54) LED PACKAGE WITH BOUNDING DAM SURROUNDING LED CHIP AND THERMOSET ENCAPSULATION ENCLOSING LED CHIP AND METHOD FOR MANUFACTURING THE SAME

(75) Inventor: Shen-Bo Lin, Hsinchu Hsien (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 296 days.

(21) Appl. No.: 13/029,125

(22) Filed: Feb. 17, 2011

(65) Prior Publication Data

US 2012/0025243 A1     Feb. 2, 2012

(30) Foreign Application Priority Data

Aug. 2, 2010   (CN) .......................... 2010 1 0242303

(51) Int. Cl.
    *H01L 33/52*      (2010.01)

(52) U.S. Cl.
    USPC ......... 257/99; 257/100; 257/E33.059; 438/26

(58) Field of Classification Search
    None
    See application file for complete search history.

(56) References Cited

U.S. PATENT DOCUMENTS

| | | | |
|---|---|---|---|
| 7,859,002 B2* | 12/2010 | Nagai et al. | 257/98 |
| 2007/0170454 A1* | 7/2007 | Andrews | 257/100 |
| 2008/0121922 A1* | 5/2008 | Chen | 257/99 |

* cited by examiner

*Primary Examiner* — Wensing Kuo
(74) *Attorney, Agent, or Firm* — Altis Law Group, Inc.

(57) ABSTRACT

An LED package includes a substrate, an LED chip, a bounding dam, and a first encapsulation. The substrate includes a first surface and a second surface opposite to the first surface. The LED chip is mounted on the first surface of the substrate. The bounding dam is formed on the first surface of the substrate and surrounds the LED chip. The bounding dam and the substrate cooperatively define a receiving space. The bounding dam is made of thermoset resin. The first encapsulation is formed in the receiving space and encloses the LED chip.

18 Claims, 6 Drawing Sheets

LED PACKAGE WITH BOUNDING DAM SURROUNDING LED CHIP AND THERMOSET ENCAPSULATION ENCLOSING LED CHIP AND METHOD FOR MANUFACTURING THE SAME

BACKGROUND

1. Technical Field

The present disclosure relates to semiconductor packages and, particularly, to an LED (light emitting diode) package and a method for manufacturing the LED package.

2. Description of Related Art

Typically, an LED package includes a substrate, an LED chip mounted on the substrate, and an encapsulation formed on the substrate to enclose the LED chip. The encapsulation is usually formed on the substrate by molding; that is, the encapsulation is formed by filling melted encapsulation into a mold and then being solidified after cooling. Thereafter, the mold is removed to leave the solidified encapsulation. The use of a mold increases the cost of manufacturing the LED package. The waiting of time for the melted encapsulation to be cooled is time-consuming, which decreases the manufacturing efficiency of the LED package. Finally, the removal of the mold may cause a damage to the solidified encapsulation if the operation is not carefully proceeded.

What is needed is an LED package and a method for manufacturing the LED package which can ameliorate the problem of the prior art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiments of the present disclosure will now be described in detail below, with reference to the accompanying drawing.

Figure 1:
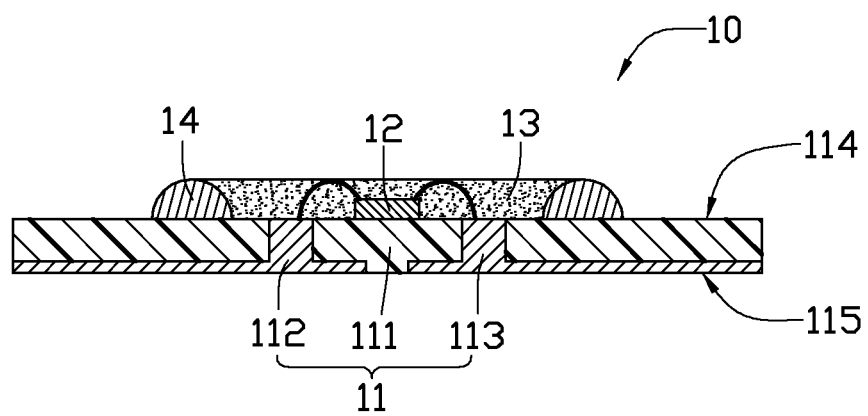
FIG. 1 is a schematic, cross-sectional view of an LED package according to a first exemplary embodiment.

Referring to FIG. 1, an LED package 10 according to a first exemplary embodiment is shown. The LED package 10 includes a substrate 11, an LED chip 12, a first encapsulation 13, and a bounding dam 14.

The substrate 11 includes an insulator 111, a first electrode 112 and a second electrode 113. The insulator 111 includes a first surface 114 and a second surface 115 opposite to the first surface 114. Each of the first electrode 112 and the second electrode 113 extends from the first surface 114 to the second surface 115, so that the LED package 10 can be conveniently mounted on a circuit board (not shown) using surface mounting technology. The insulator 111 is made of thermally conductive and electrically insulating material such as epoxy, silicone, silicon oxide or a mixture thereof. The first electrode 112 and the second electrode 113 can be made of metal or alloy such as indium tin oxide (ITO), copper (Cu), nickel (Ni), silver (Ag), aluminum (Al), tin (Sn), gold (Au) or an alloy thereof.

The LED chip 12 is mounted on the first surface 114 of the substrate 11, and is electrically connected to the first electrode 112 and the second electrode 113. In the present embodiment, the LED chip 12 is electrically connected to the first electrode 112 and the second electrode 113 via two wires (not labeled).

The bounding dam 14 is formed on the first surface 114 of the substrate 11, and surrounds the LED chip 12. The bounding dam 14 and the substrate 11 cooperatively form a receiving space 141 (shown in FIG. 2). The bounding dam 14 is made of thermoset resin, such as thermoset epoxy resin, thermoset silicone resin, or a mixture thereof. In order to improve the solidifying speed of the thermoset resin, the thermoset resin for forming the bounding dam 14 can include a solidified agent. The bounding dam 14 can further include reflective particles therein, such as titanium oxide particles; thus, the bounding dam 14 can reflect the light emitted from the LED chip 12.

The first encapsulation 13 is filled into the receiving space 141 for protecting the LED chip 12 from dust, water etc. In the present embodiment, the first encapsulation 13 further includes fluorescent powder, such as YAG, TAG, silicate, nitride, nitrogen oxides, phosphide or sulfide. The fluorescent powder is used for changing color of light from the LED chip 12 into a different color.

Figure 2:
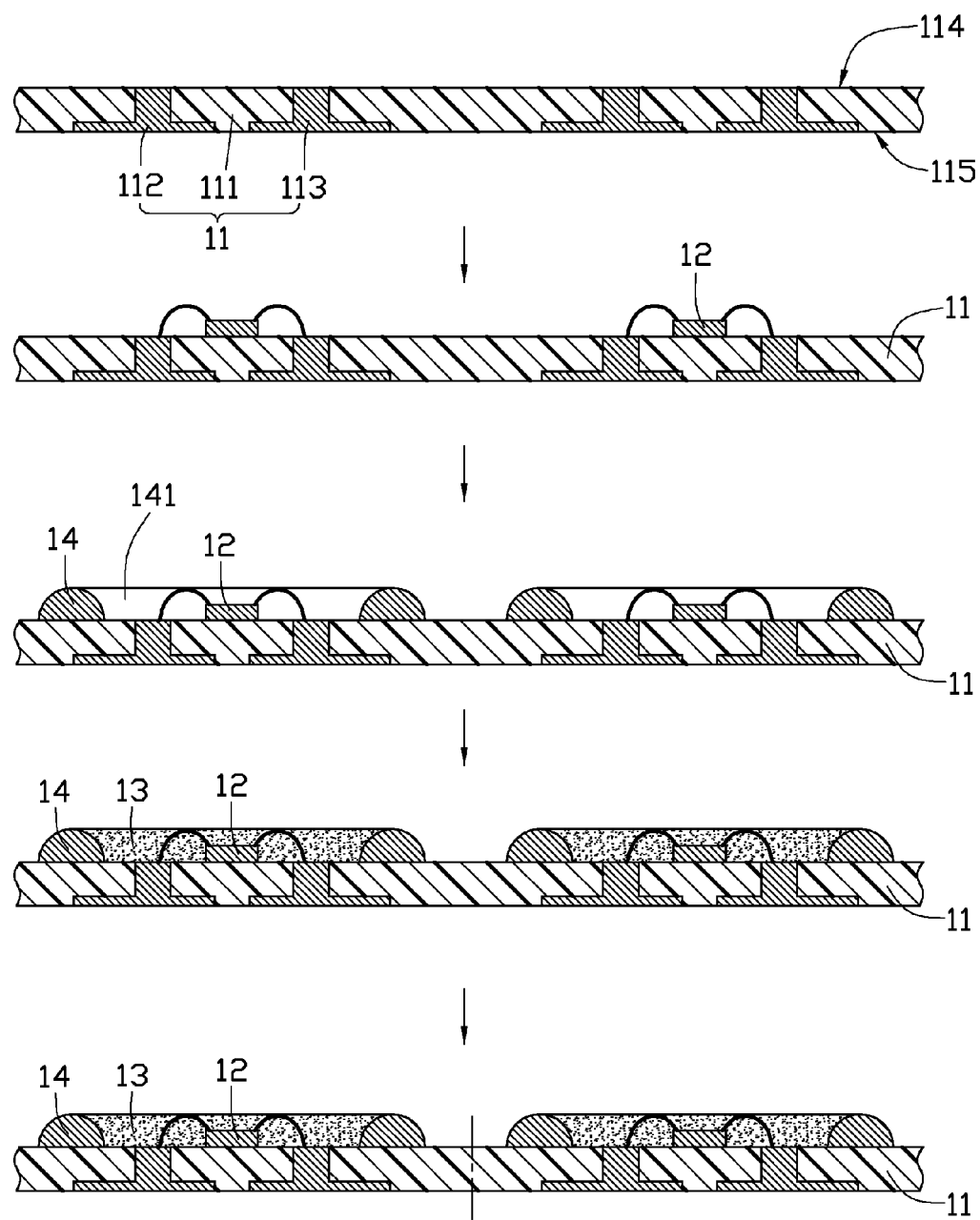
FIG. 2 is a schematic view of a method for manufacturing the LED package of FIG. 1.

Referring to FIG. 2, a method for manufacturing the LED package 10 according to a first exemplary embodiment is shown. The method includes following steps:

The first step is to provide the substrate 11. The substrate 11 includes an insulator 111, a first electrode 112 and a second electrode 113. The insulator 111 includes a first surface 114 and a second surface 115 opposite to the first surface 114.

The second step is to mount the LED chip 12 on the substrate 11, and electrically connect the LED chip 12 to the first electrode 112 and the second electrode 113. In the present embodiment, the LED chip 12 is electrically connected to the first electrode 112 and the second electrode 113 via two wires (not labeled).

The third step is to form the bounding dam 14 on the substrate 11. The bounding dam 14 surrounds the LED chip 12. The bounding dam 14 and the substrate 11 cooperatively form a receiving space 141. The bounding dam 14 can be formed on the substrate 11 by coating, casting, printing, lamination, compression etc. Preferably, the viscosity of the thermoset resin for forming the bounding dam 14 in liquid state is larger than 300 Pa·s. If the thermoset resin has a relatively larger viscosity, the flowability of the thermoset resin will be relatively small; thus, the thermoset resin can be applied on the substrate 11 without using a mold, and then the thermoset resin can be heated to form the bounding dam 14 in a solidified state. In other embodiment, the bounding dam 14 can also be formed on the substrate 11 before the LED chip 12 being mounted on the substrate 11.

The fourth step is to form the first encapsulation 13. The first encapsulation 13 can be formed in the receiving space 141 by injection or transferring of liquid first encapsulation; the receiving space 141 functions as a cavity to receive therein the injected or transferred liquid first encapsulation 13. The first encapsulation 13 can further include fluorescent powder, such as YAG, TAG, silicate, nitride, nitrogen oxides, phosphide or sulfide. Thereafter, the liquid first encapsulation 13 is put until it is solidified. The first encapsulation 13 is made of resin or silicon.

In the present embodiment, the method for manufacturing the LED package 10 can be a wafer level package, i.e. formation of a plurality of LED packages 10 on a wafer substrate, and the method can further include a fifth step: cutting and separating each LED package 10.

Figure 3:
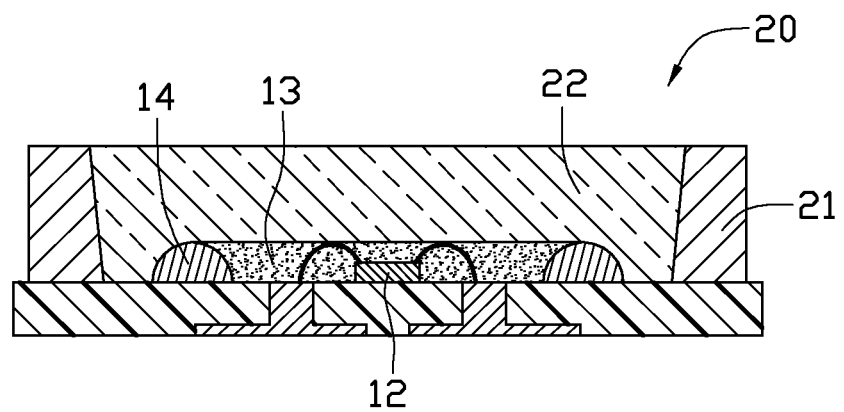
FIG. 3 is a schematic, cross-sectional view of an LED package according to a second exemplary embodiment.

Referring to FIG. 3, an LED package 20 according to a second exemplary embodiment is shown. The LED package 20 is similar to the LED package 10 of first exemplary embodiment; the difference between the LED package 20 and the LED package 10 is that: the LED package 20 further includes a reflective cup 21 surrounding the bounding dam 14, and a second encapsulation 22 filled in the reflective cup 21 for enclosing the bounding dam 14 and the first encapsulation 13. The reflective cup 21 is configured for reflecting the light irradiating thereon. In the present embodiment, the height of the reflective cup 21 is larger than that of the bounding dam 14, and the reflective cup 21 and the bounding dam 14 are made of a same material.

Figure 4:
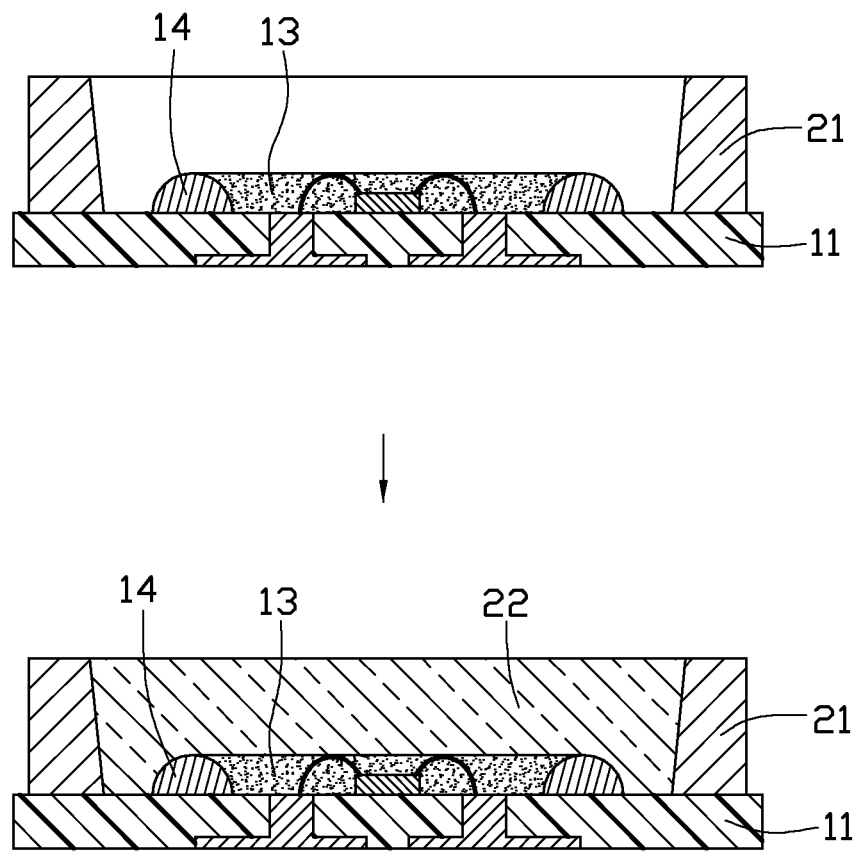
FIG. 4 is a schematic view of a method for manufacturing the LED package of FIG. 3.

Referring to FIG. 4, a method for manufacturing the LED package 20 according to a second exemplary embodiment is shown. The method for manufacturing the LED package 20 is similar to the method for manufacturing the LED package 10; the difference therebetween is that the method for manufacturing the LED package 20 further includes: forming the reflective cup 21 surrounding the bounding dam 14, and forming the second encapsulation 22 in the reflective cup 21 for enclosing the bounding dam 14 and the first encapsulation 13.

Figure 5:
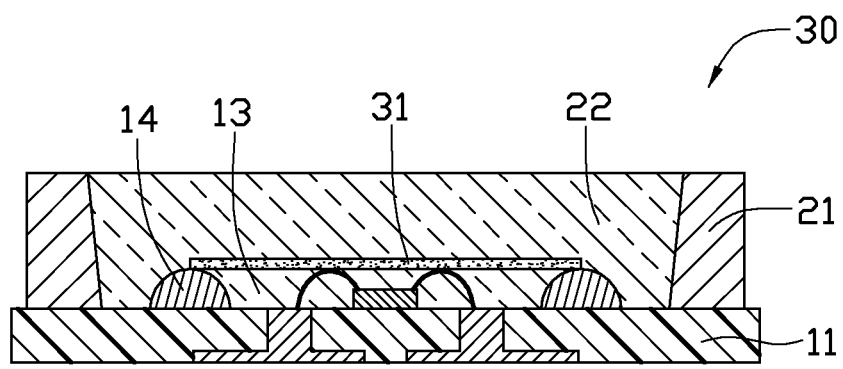
FIG. 5 is a schematic, cross-sectional view of an LED package according to a third exemplary embodiment.

Referring to FIG. 5, an LED package 30 according to a third exemplary embodiment is shown. The LED package 30 is similar to the LED package 20 of second exemplary embodiment; the difference between the LED package 30 and the LED package 20 is that: the first encapsulation 13 of the LED package 30 does not includes fluorescent powder, and the LED package 30 further includes a fluorescent powder layer 31 arranged on a top surface of the first encapsulation 13 away from the substrate 11. The second encapsulation 22 encloses the bounding dam 14 and the fluorescent powder layer 31.

Figure 6:
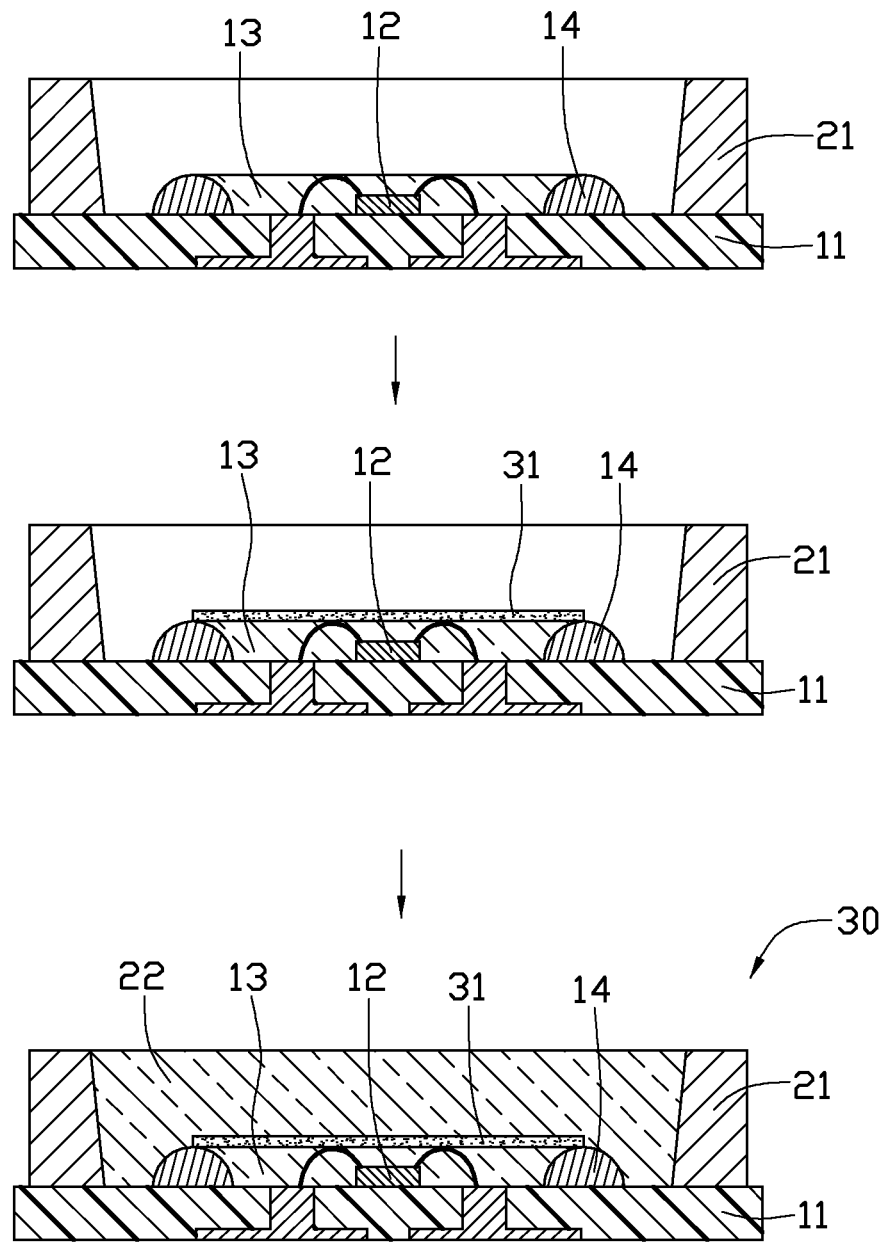
FIG. 6 is a schematic view of a method for manufacturing the LED package of FIG. 5.

Referring to FIG. 6, a method for manufacturing the LED package 30 according to a third exemplary embodiment is shown. The method for manufacturing the LED package 30 is similar to the method for manufacturing the LED package 20. The difference therebetween is that the method for manufacturing the LED package 30 further includes: forming the fluorescent powder layer 31 on the top surface of the first encapsulation 13 before forming the second encapsulation 22.

While certain embodiments have been described and exemplified above, various other embodiments will be apparent to those skilled in the art from the foregoing disclosure. The disclosure is not limited to the particular embodiments described and exemplified, and the embodiments are capable of considerable variation and modification without departure from the scope and spirit of the appended claims.

What is claimed is:

1. An LED package comprising:
   a substrate comprising a first surface and a second surface opposite to the first surface;
   an LED chip mounted on the first surface of the substrate;
   a bounding dam formed on the first surface of the substrate and surrounding the LED chip, the bounding dam and the substrate cooperatively defining a receiving space, the bounding dam being made of thermoset resin; and
   a first encapsulation formed in the receiving space and enclosing the LED chip; and
   a reflective cup surrounding the bounding dam and a second encapsulation filled in the reflective cup for enclosing the bounding dam and the first encapsulation.

2. The LED package as claimed in claim 1, wherein the thermoset resin is selected from the group consisting of thermoset epoxy resin, thermoset silicone resin, and a mixture thereof.

3. The LED package as claimed in claim 1, wherein the thermoset resin comprises a solidified agent.

4. The LED package as claimed in claim 1, wherein the bounding dam comprises reflective particles.

5. The LED package as claimed in claim 1, wherein the first encapsulation comprises fluorescent powder therein.

6. The LED package as claimed in claim 5, wherein the fluorescent powder is selected from the group consisting of YAG, TAG, silicate, nitride, nitrogen oxides, phosphide and sulfide.

7. The LED package as claimed in claim 1, wherein a height of the reflective cup is larger than that of the bounding dam.

8. The LED package as claimed in claim 1, wherein the reflective cup and the bounding dam are made of a same material.

9. The LED package as claimed in claim 1 further comprising a fluorescent powder layer arranged on a top surface of the first encapsulation away from the substrate.

10. A method for manufacturing an LED package comprising:
    providing a substrate, the substrate comprising a first surface and a second surface opposite to the first surface;
    mounting an LED chip on the first surface of the substrate, and forming a bounding dam surrounding the LED chip on the substrate, the bounding dam and the substrate cooperatively defining a receiving space, the bounding dam being made of thermoset resin; and
    forming a first encapsulation in the receiving space to enclose the LED chip; and
    forming a reflective cup surrounding the bounding dam, and forming a second encapsulation in the reflective cup for enclosing the bounding dam and the first encapsulation.

11. The method as claimed in claim 10, wherein the bounding dam is formed on the substrate by coating, casting, printing, lamination, or compression.

12. The method as claimed in claim 10, wherein a viscosity of the thermoset resin in liquid state is larger than 300 Pa·s.

13. The method as claimed in claim 10, wherein the first encapsulation is formed in the receiving space by injection or transferring of liquid first encapsulation into the receiving space.

14. The method as claimed in claim 10, wherein the thermoset resin is selected from the group consisting of thermoset epoxy resin, thermoset silicone resin, and a mixture thereof.

15. The method as claimed in claim 10, wherein the thermoset resin comprises a solidified agent.

16. The method as claimed in claim 10, wherein the bounding dam comprises reflective particles.

17. The method as claimed in claim 10, wherein a height of the reflective cup is larger than that of the bounding dam.

18. The method as claimed in claim 10 further comprising forming a fluorescent powder layer on a top surface of the first encapsulation away from the substrate.

* * * * *